United States Patent [19]

Toshiyasu et al.

[11] Patent Number: 4,677,344
[45] Date of Patent: Jun. 30, 1987

[54] DISPLAY DEVICE

[75] Inventors: Masayuki Toshiyasu, Muko; Toshinari Kawahara, Nagaoka-Kyo, both of Japan

[73] Assignee: Mitsubishi Denki Kabushiki Kaisha, Tokyo, Japan

[21] Appl. No.: 712,097

[22] Filed: Mar. 15, 1985

[30] Foreign Application Priority Data

Apr. 13, 1984 [JP] Japan ................... 59-75241

[51] Int. Cl.⁴ .................... H01J 1/52; H01J 5/02
[52] U.S. Cl. .......................... 315/85; 315/8; 313/479; 361/399; 361/415
[58] Field of Search ............... 358/245, 247, 254, 253, 358/903; 315/8, 85; 313/479; 361/399, 414, 415; 318/8, 85

[56] References Cited

U.S. PATENT DOCUMENTS

| 3,029,365 | 4/1962 | Plesser | 361/399 |
| 3,329,871 | 7/1967 | Smith | 315/8 |
| 4,152,671 | 5/1979 | Tuma et al. | 361/399 |
| 4,393,436 | 7/1983 | Sugiura | 361/399 |
| 4,542,076 | 9/1985 | Bednarz et al. | 315/85 |
| 4,611,261 | 9/1986 | Suwa | 361/399 |

FOREIGN PATENT DOCUMENTS

| 2612986 | 10/1976 | Fed. Rep. of Germany . |
| 2720305 | 4/1978 | Fed. Rep. of Germany . |
| 2540011 | 12/1978 | Fed. Rep. of Germany . |
| 3103382 | 11/1982 | Fed. Rep. of Germany . |
| 3210826 | 10/1983 | Fed. Rep. of Germany . |

Primary Examiner—Saxfield Chatmon
Attorney, Agent, or Firm—Oblon, Fisher, Spivak, McClelland & Maier

[57] ABSTRACT

In a display device provided with a main substrate having the lower surface on which a metallic layer is formed and the upper surface on which at least a power source or a deflection circuit is arranged, a plate member having one surface formed by an insulating material and the other surface formed by a metallic material is placed with its insulating material facing the lower surface of the main substrate.

9 Claims, 4 Drawing Figures

FIGURE 1
FIGURE 2
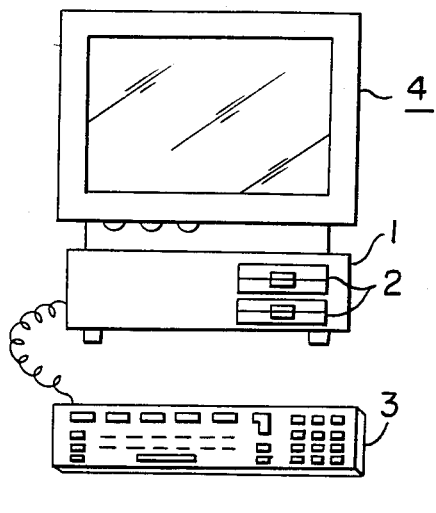
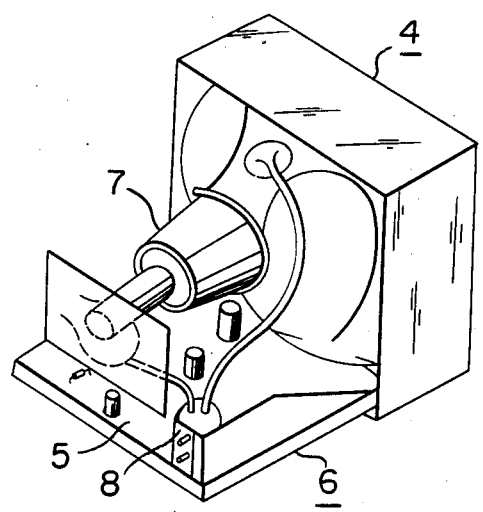
FIGURE 3
FIGURE 4
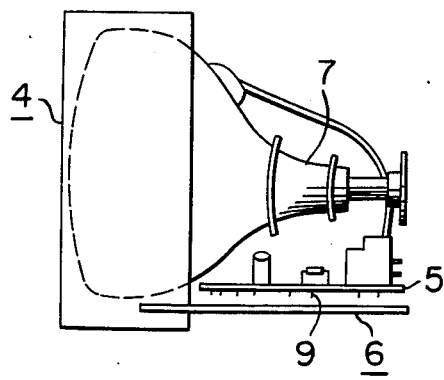
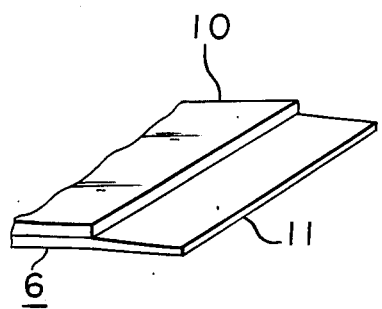

DISPLAY DEVICE

BACKGROUND OF THE INVENTION

1. Field of the Invention

The present invention relates to a display device or a television receiver used in combination with a computer device such as a personal computer. More particularly, it relates to a display device for giving remarkable reduction in disturbing noise which adversely affects a magnetic memory device, for instance, a floppy disc drive.

2. Description of Prior Art

Personal computers have more and more been developed and used in wide range. Various types of the personal computers have been presented in commercial scale along with a display device or color-television receiver.

It is a recent tendency to provide a separate type personal computer in which a main body of C.P.U., a key board and a display device are separated and a magnetic memory device such as a floppy disc drive (hereinbelow referred to as a FDD) is placed in the C.P.U.

FIG. 1 is a schematic view in combination of these devices. In FIG. 1, a reference numeral 1 designates a main casing inclusive of a C.P.U. as an essential part of a personal computer (referred to as C.P.U.), numeral 2 designates a FDD as an auxiliary memory device, a numeral 3 designates a key board and a numeral 4 designates a display device which may be one of an exclusive use or a television receiver which receives a signal at an antenna input part through a converter.

In the C.P.U. 1 in such a system, a magnetic head (not shown) is provided in the FDD 2 and is electromagnetically coupled to a disket used for the FDD to write in and read out signals. In the system, however, when a needless magnetic field is formed around the magnetic head, there causes overlapping of needless noise coupled with the magnetic head on the original signal thereby causing malfunction of the FDD 2. Particularly, when the display device 4 is directly put on the C.P.U. 1 as shown FIG. 1, electromagnetic field noise emitted from the display device 4 is directly effected to the FDD 2 to cause a fatal defect.

As electromagnetic field noise emitted from the display device 4, there is leakage flux having a horizontal deflection frequency produced from coils which are mainly used in a horizontal deflection system comprising a deflection yoke, a flyback transformer, and so on and switching noise in a power source circuit. The former is noise of 15.7 KHz–24 KHz and the latter is one having a frequency component produced by switching the power source circuit. Interference noise is also generated from a copper-layered pattern on a substrate on which a power source or a deflection circuit are provided.

As an attempt to prevent the malfunction of the FDD 2 caused by the electromagnetic field noise generated from the display device 4, it is considered that a shielding mat is interposed between the C.P.U. 1 and the display device 4. It is, however, disadvantageous in that handling works are troublesome and the quality of the system as a commodity is poor.

SUMMARY OF THE INVENTION

It is an object of the present invention to provide a display device provided with a main substrate having the lower surface on which a metallic layer is formed and the upper surface on which at least a power source or a deflection circuit is arranged, characterized in that a plate member having one surface formed by an insulating material and the other surface formed by a metallic material is placed with its insulating matreial facing the lower surface of the main substrate.

The foregoing and the other objects of the present invention have been attained by providing a display device provided with a main substrate having the lower surface on which a metallic layer is formed and the upper surface on which at least a power source or a deflection circuit is arranged, wherein a plate member having one surface formed by an insulating material and the other surface formed by a metallic material is placed with its insulating material facing the lower surface of the main substrate.

BRIEF DESCRIPTION OF THE DRAWING

FIG. 1 is a schematic view showing combination of a display device, a main body of C.P.U. and a key board;

FIG. 2 is a perspective view of an important part of an embodiment of the display device according to the present invention; and FIG. 3 is a schematic side view of the display device; and FIG. 4 is a schematic view of a plate member used for the present invention.

DETAILED DESCRIPTION OF THE INVENTION

An embodiment of the present invention will be described with reference to FIGS. 2 through 4.

In the FIGURES, there is provided a main substrate 5 having the lower surface on which a metallic layer of copper-layered pattern is formed and the upper surface on which a deflection circuit and a power source circuit comprising a deflection yoke 7 and a flyback transformer 8 and so on are arranged in which legs 9 of components arranged on the upper surface project from the lower surface. A plate member 6 having one surface consisting of an insulating material 10 and the other surface consisting of a metallic material 11 having a high conductivity is provided so that the insulating material faces the lower surface of the substrate 5. In this embodiment, particularily, the plate member 6 is formed of a insulating plate made of phenol or formaldehyde resin (corresponding to the insulating material 10) and a printed copper-layered pattern (corresponding to the metallic layer 11) is formed in one surface of the insulating plate.

In the display device having the construction as above-mentioned, there takes place electromagnetic noises caused by a leakage magnetic field having a horizontal deflection frequency from coils used in a horizontal deflection system such as the deflection yoke 7, the flyback transfomer 8 and so on; switching noises of the power source circuit and noises produced in the metallic layer of the substrate 5. In the embodiment of the present invention, however, there is no adverse effect of the electromagnetic noises on the lower side of the plate member 6 because the noises is shielded by the metallic layer 11 of the plate member 6. Namely, the electromagnetic noises are mainly of a frequency band ranging from 15.7 KHz–24 KHz and the electromagnetic noises cause eddy current in the metallic layer 11 of the plate member 6 so that a magnetic field resulted by the eddy current cancels the electromagnetic noises. Further, since the insulating material 10 of the plate member 6 is provided opposing the lower surface of the substrate 5, it is possible to place the plate member 6 in the vicinity of the lower surface of the substrate 5 without taking account of insulation of the legs 9 of the components projecting from the substrate 5 and insulation of the metallic layer, whereby further effective cancellation of the electromagnetic noises can be obtained.

Thus constructed display device was assembled to the C.P.U. 1 as shown in FIG. 1 to operate the system and it was found that there was no erroneous operation of the FDD 2.

Thus, the electromagnetic noises can be effectively shielded by the plate member 6 and it is unnecessary to carefully consider insulation of the legs 9 of the components projecting from the lower surface of the substrate 5 because of provision of the insulating material 10 of the plate member 6. Accordingly, it is easy to arrange the plate member 6 in the vicinity of the lower surface of the substrate 5 and use of a single-surface-printed substrate as the plate member 6 renders the system to be economical.

On the other hand, in display devices of this type, there is the risk that an AFC circuit provided on the upper surface of the substrate 5 is adversely affected by a magnetic field caused by an eddy current in the metallic material 11 of the plate member 6 due to restriction in the arrangement to cause disturbance of the AFC circuit. However, such problem can be easily eliminated by grounding the metallic material 11 of the plate member 6 to the casing of the display device.

In the above-mentioned embodiment, description has been made as to a single of the plate member 6 placed underneath the substrate 5. However, a plurality of plate members can be provided to obtain further sealing effect.

Thus, in the display device according to the present invention, the electromagnetic noises produced in the power source circuit, the deflection circuit and the related components can be effectively shielded by the metallic material of the plate member so that adverse affect of the electromagnetic noises to the lower side of the plate member can be eliminated by placing the plate member with the insulating layer facing the lower surface of the substrate.

Accordingly, in accordance with the present invention, components placed below the display device do not undergo, adverse affect of the electromagnetic noises produced in the display device.

We claim:

1. A display device for a computer mounted in close proximity thereto, said display device comprising:
   a cabinet;
   a cathode ray tube mounted in said cabinet;
   a main substrate having an upper and lower surface, with said lower surface being a metallic layer;
   circuitry connected to said cathode ray tube, mounted on said upper surface and producing electromagnetic field noise; and
   a plate member having one surface formed with an insulating material and the opposite surface formed with a metallic material placed beneath the lower surface of said substrate with the insulating material facing the substrate;
   wherein the metallic material prevents the electromagnetic noise from reaching the computer and wherein the insulating material allows the plate member to be placed in close proximity to the substrate for more effective cancellation of the electromagnetic noise.

2. The display device according to claim 1, wherein said metallic material of said plate member is connected to the ground.

3. The display device according to claim 1, wherein said circuitry is a power source.

4. The display device according to claim 1, wherein said metallic material of said plate member is metal having high conductivity.

5. The display device according to claim 4, wherein said metallic material of said plate member is copper.

6. The display device according to claim 1, wherein said plate member is a single-surface-printed substrate which is provided with an insulating plate of resinous material and a copper layer formed in the entire area of one surface of said insulating plate.

7. The display device according to claim 1, wherein said plate member is formed by piling up a plurality of plates.

8. The display device according to claim 1, wherein said circuitry is a deflection circuit.

9. The display device according to claim 8, wherein said main substrate is a substrate having the lower surface on which a copper-layered pattern of a metallic layer is formed by printing technique and a deflection circuit arranged on the upper surface of said printed substrate includes a deflection coil and a flyback transformer.

* * * * *